United States Patent
Oh et al.

(10) Patent No.: US 9,871,168 B2
(45) Date of Patent: Jan. 16, 2018

(54) LIGHT EMITTING DIODE DEVICE HAVING CONNECTED LIGHT EMITTING DIODE ELEMENTS AND METHOD OF FABRICATING THE SAME

(71) Applicant: Seoul Viosys Co., Ltd., Ansan-si (KR)

(72) Inventors: Se Hee Oh, Ansan-si (KR); Yeo Jin Yoon, Ansan-si (KR); Jong Kyu Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/954,835

(22) Filed: Nov. 30, 2015

(65) Prior Publication Data
US 2016/0155899 A1    Jun. 2, 2016

Related U.S. Application Data

(63) Continuation-in-part of application No. PCT/KR2014/004496, filed on May 20, 2014.

(30) Foreign Application Priority Data

May 29, 2013   (KR) .......................... 10-2013-0061220

(51) Int. Cl.
*H01L 33/20*   (2010.01)
*H01L 27/15*   (2006.01)
(Continued)

(52) U.S. Cl.
CPC ............ *H01L 33/20* (2013.01); *H01L 27/153* (2013.01); *H01L 33/0095* (2013.01); *H01L 33/62* (2013.01)

(58) Field of Classification Search
CPC ..... H01L 33/02; H01L 33/06; H01L 33/0095; H01L 33/20; H01L 33/62; H01L 27/153
See application file for complete search history.

(56) References Cited

U.S. PATENT DOCUMENTS

| 2001/0000209 A1 | 4/2001 | Krames et al. |
| 2012/0061694 A1* | 3/2012 | Shen .................... H01L 25/0753 257/88 |
| 2014/0175465 A1* | 6/2014 | Lee ......................... H01L 27/15 257/88 |

FOREIGN PATENT DOCUMENTS

| CN | 102403330 A | 4/2012 |
| JP | 2759275 B2 | 5/1998 |

(Continued)

OTHER PUBLICATIONS

First Office Action in Chinese Patent Application No. 201480031234.0, dated Mar. 22, 2017 (English translation only), 9 pages.

(Continued)

*Primary Examiner* — Armando Rodriguez
(74) *Attorney, Agent, or Firm* — Perkins Coie LLP

(57) ABSTRACT

Disclosed is a light emitting diode including a plurality of light emitting diode elements and a method of fabricating the same. The light emitting diode includes: a substrate; a plurality of light emitting diode elements disposed on the substrate; interconnection lines connecting the light emitting diode elements to each other, wherein the plurality of light emitting diode elements comprise outer light emitting diode elements aligned along an edge of the substrate, each of the outer light emitting diode elements comprises an inner face directed towards an adjacent light emitting diode element and an outer face disposed adjacent the edge of the substrate and directed towards an outside of the substrate, and the inner face of at least one of the outer light emitting diode elements comprises a more gently slanted side surface than the outer face thereof.

13 Claims, 3 Drawing Sheets

(51) Int. Cl.
*H01L 33/00* (2010.01)
*H01L 33/62* (2010.01)

(56) References Cited

FOREIGN PATENT DOCUMENTS

| JP | 2009-117662 | * | 5/2009 |
| JP | 2009-117662 A | | 5/2009 |
| KR | 10-0663910 B1 | | 1/2007 |
| KR | 10-2012-0086878 A | | 8/2012 |

OTHER PUBLICATIONS

Park, H. L., Authorized Officer, Korean Intellectual Property Office, International Application No. PCT/KR2014/004496, Sep. 2, 2014, 2 pages.

* cited by examiner

[Figure 1]
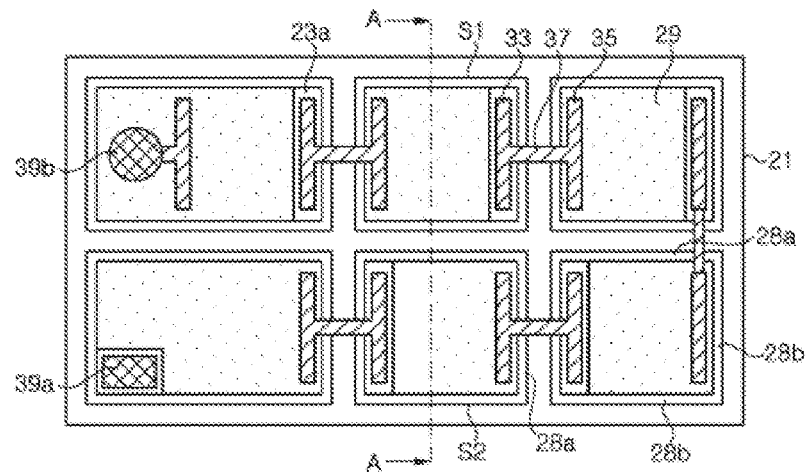
[Figure 2]
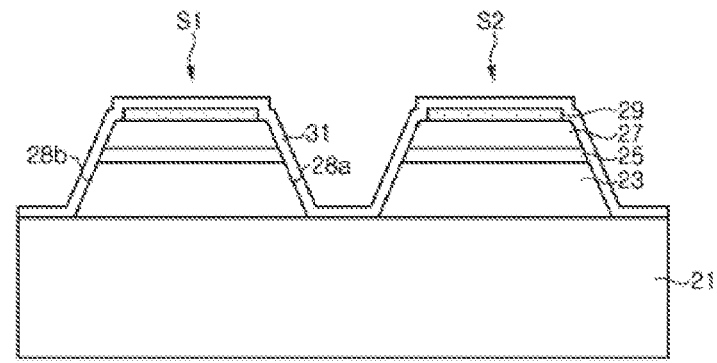
[Figure 3]
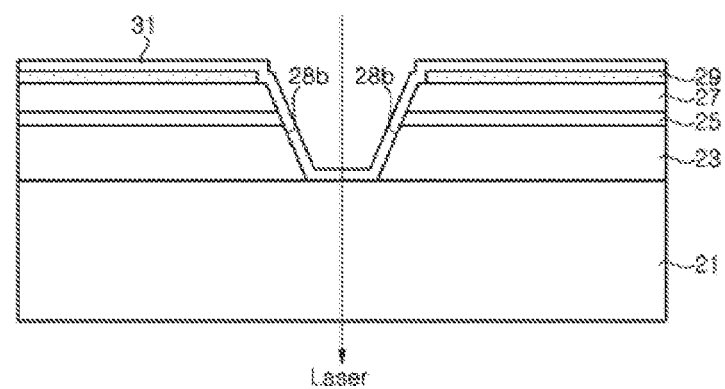

[Figure 4]
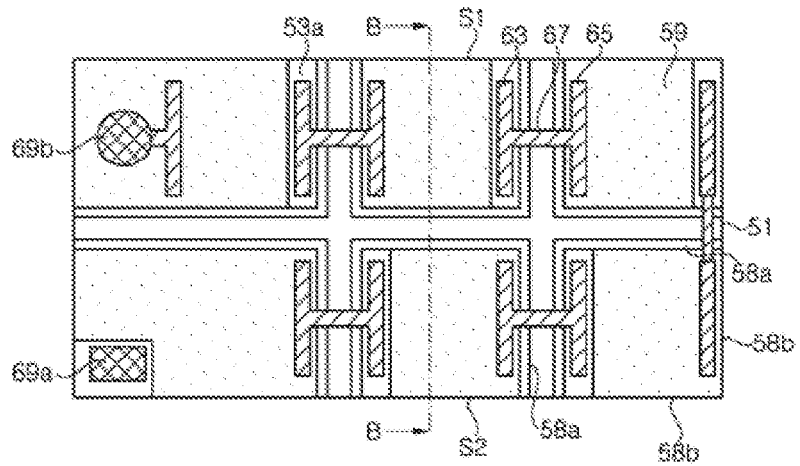
[Figure 5]
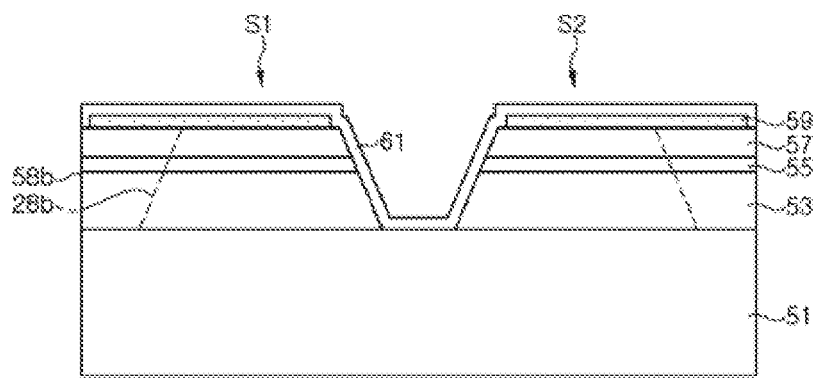
[Figure 6]
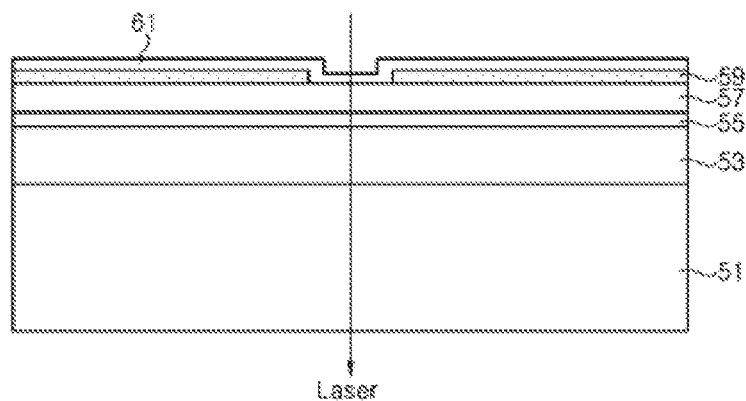

[Figure 7]
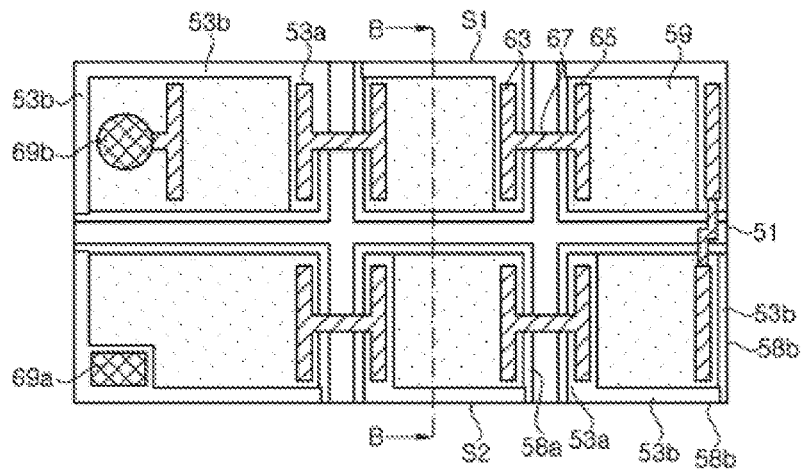
[Figure 8]
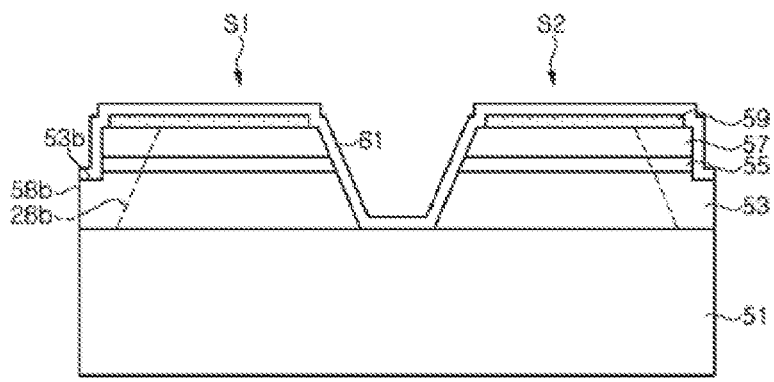
[Figure 9]
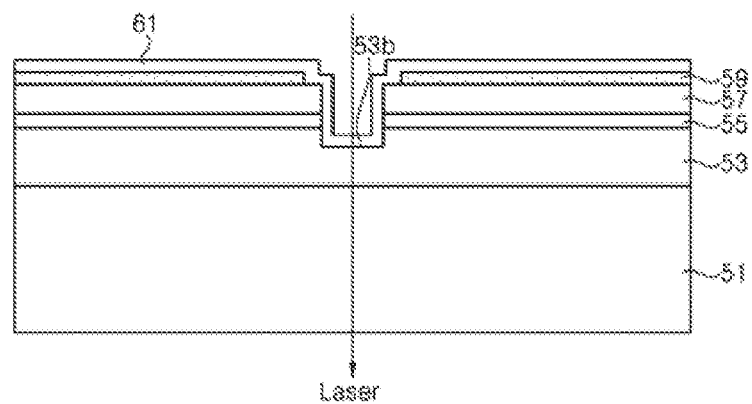

LIGHT EMITTING DIODE DEVICE HAVING CONNECTED LIGHT EMITTING DIODE ELEMENTS AND METHOD OF FABRICATING THE SAME

PRIORITY CLAIM

This patent document is a continuation-in-part of, and claims the benefits and priority of International Application No. PCT/KR2014/004496 filed on May 20, 2014 which claims the benefits and priority of Korean Patent Application No. 10-2013-0061220 filed on May 29, 2013. The entire disclosures of the above applications are incorporated by reference as part of this patent document.

TECHNICAL FIELD

This patent document relates to a light emitting diode device having a plurality of light emitting diode elements and associated device fabrication.

BACKGROUND

Light emitting diodes (LEDs) are widely used for display devices and backlight units. In various applications, due to the low power consumption and long lifespan of LEDs as compared with existing incandescent lamps or fluorescent lamps, applications of the light emitting diodes have expanded to general lighting by replacing existing incandescent lamps, fluorescent lamps, and the like.

SUMMARY

The embodiments of light emitting diode devices disclosed herein connect different light emitting diode elements formed on a substrate.

In one aspect, a light emitting diode device is provided to include a substrate; a plurality of light emitting diode elements disposed on the substrate and including outer light emitting diode elements that are aligned along an edge of the substrate; and interconnection lines formed on the substrate to connect the light emitting diode elements in series with one another, wherein each of the outer light emitting diode elements includes an inner face directed towards an adjacent light emitting diode element and an outer face disposed adjacent the edge of the substrate and directed towards an outside of the substrate, and the inner face includes a more gently slanted side surface than the outer face thereof. In some implementations, at least one of the outer light emitting diode elements includes a first side surface disposed adjacent an edge of a side surface of the substrate and a second side surface disposed adjacent an edge of another side surface of the substrate. In some implementations, at least one of the outer light emitting elements is disposed on an edge portion of the substrate and the edge portion is adjacent to a corner where two side surfaces of the substrate meet each other. In some implementations, each of the interconnection lines connects adjacent light emitting diode elements to each other through the more gently slanted side surface than the outer face. In some implementations, the outer face of at least one of the outer light emitting diode elements comprises a side surface perpendicular to the substrate. In some implementations, each of the outer faces of the outer light emitting diode elements comprises a side surface perpendicular to the substrate. In some implementations, the perpendicular side surfaces are flush with a side surface of the substrate. In some implementations, each of the outer light emitting diode elements includes a stepped portion. In some implementations, each of the light emitting diode elements comprises a first conductivity type semiconductor layer, an active layer and a second conductivity type semiconductor layer, the stepped portion being formed on the first conductivity type semiconductor layer, side surfaces of the active layer and the second conductivity type semiconductor layer being covered with an insulation layer.

In another aspect, a method is provided for fabricating a light emitting diode device including a plurality of light emitting diode elements. This method includes growing a semiconductor stack on a substrate, the semiconductor stack comprising a first conductivity type semiconductor layer, an active layer, and a second conductivity type semiconductor layer; patterning the semiconductor stack to form an isolation trench in a unit light emitting diode chip area; and dividing the semiconductor stack and the substrate using a laser. In some implementations, the plurality of light emitting diode elements comprise outer light emitting diode elements aligned along an edge of the substrate. In some implementations, each of the outer light emitting diode elements comprises an inner face formed by the isolation trench and an outer face formed by dividing the semiconductor stack using the laser. In some implementations, the inner face comprises a more gently slanted side surface than the outer face. In some implementations, the method further comprises: etching the second conductivity type semiconductor layer and the active layer to expose the first conductivity type semiconductor layer before or after forming the isolation trench. In some implementations, the method further comprises: forming interconnection lines connecting adjacent first and second conductivity type semiconductor layers to each other across the isolation trench. In some implementations, the first conductivity type semiconductor layer is exposed in a contact area for forming an ohmic contact and in a scribing line area. In some implementations, the method further comprises: forming an insulation layer covering the isolation trench and the scribing line area, the insulation layer exposing the contact area.

In yet another aspect, a light emitting diode device is provided to include a substrate; and a plurality of light emitting diode elements disposed on the substrate, wherein at least one of the light emitting diode elements includes a side surface slanted at an angle of less than 90° relative to an upper surface of the substrate and a side surface perpendicular to the upper surface of the substrate. In some implementations, at least one of the light emitting diode elements includes a first side surface disposed adjacent an edge of a side surface of the substrate and a second side surface disposed adjacent an edge of another side surface of the substrate. In some implementations, at least one of the light emitting elements being disposed on an edge portion of the substrate wherein the edge portion is adjacent to a corner where two side surfaces of the substrate meet each other. In some implementations, the perpendicular side surface is flush with a side surface of the substrate.

Those and other aspects and their implementations are described in greater detail in the drawings, the description and the claims.

BRIEF DESCRIPTION OF DRAWINGS

FIG. 1 is a schematic plan view of a light emitting diode device in the related art.

FIG. 2 is a schematic cross-sectional view of the light emitting diode device taken along line A-A of FIG. 1.

FIG. 3 is a schematic sectional view illustrating a method of fabricating a light emitting diode device in the related art.

FIG. 4 is a schematic plan view of a light emitting diode device according to an exemplary embodiment of the present invention.

FIG. 5 is a schematic cross-sectional view of the light emitting diode device taken along line B-B of FIG. 4.

FIG. 6 is a schematic sectional view illustrating a method of fabricating a light emitting diode device according to an exemplary embodiment of the present invention.

FIG. 7 is a schematic plan view of a light emitting diode device according to an exemplary embodiment of the present invention.

FIG. 8 is a schematic cross-sectional view of the light emitting diode device taken along line B-B of FIG. 7.

FIG. 9 is a schematic sectional view illustrating a method of fabricating a light emitting diode device according to an exemplary embodiment of the present invention.

DETAILED DESCRIPTION

Generally, light emitting diodes are operated at a predetermined forward voltage and thus cannot be operated at a high voltage because a forward bias voltage is applied from the p-type region to the n-type region across the p-n junction. To solve this problem, a light emitting diode device capable of being operated at a high voltage can be constructed by having a plurality of light emitting diode elements formed on a single substrate and connecting such light emitting diode elements to one another in series.

FIG. 1 is a plan view of a typical light emitting diode device including a plurality of light emitting diode elements and FIG. 2 is a cross-sectional view of the light emitting diode device taken along line A-A of FIG. 1.

Referring to FIG. 1 and FIG. 2, the light emitting diode device includes a substrate 21, a plurality of light emitting diode elements including light emitting diode elements S1, S2, an insulation layer 31, an n-contact 33, a p-contact 35, interconnection lines 37, an n-pad 39a, and a p-pad 39b. In addition, each of the light emitting diode elements includes an n-type semiconductor layer 23, an active layer 25, and a p-type semiconductor layer 27.

The light emitting diode elements are separated from one another and connected to one another in series between the n-pad 39a and the p-pad 39b by the interconnection lines 37. For example, each of the interconnection lines 37 connects the n-contact 33, which is electrically connected to the n-type semiconductor layer 23 of one light emitting diode element, to the p-contact 35, which is electrically connected to the p-type semiconductor layer 27 of another light emitting diode element. The n-contact 33 is connected to the n-type semiconductor layer 23a exposed by mesa-etching, and the p-contact 35 is electrically connected to the p-type semiconductor layer 27 through a transparent electrode 29.

The insulation layer 31 is disposed under the interconnection lines 37 and prevents short circuit between the n-type semiconductor layer 23 and the p-type semiconductor layer 27 in a single light emitting diode element by the interconnection lines 37. In addition, the insulation layer 31 may cover side surfaces of the light emitting diode elements and the transparent electrode 29 to protect the same from moisture and the like.

On the other hand, the n-contact 33, the p-contact 35 and the interconnection lines 37 are formed by depositing a conductive material by a deposition technique such as electron beam evaporation or sputtering, followed by patterning the conductive material. At this time, when the light emitting diode elements have perpendicular side surfaces, it can be difficult to deposit the conductive material on the side surfaces of the light emitting diode elements, thereby causing easy disconnection of the interconnection lines 37 on the side surfaces of the light emitting diode elements.

To prevent disconnection of the interconnection lines 37, as shown in FIG. 2, the side surfaces of all of the light emitting diode elements including the light emitting diode elements S1, S2 are slanted at an angle of less than 90 degrees relative to an upper surface of the substrate 21. Each of the light emitting diode elements S1, S2 has a slanted side surface 28a which faces an adjacent light emitting diode element, and a slanted side surface 28b which is adjacent an edge of the substrate 21.

FIG. 3 is a schematic sectional view illustrating a dicing process using a laser to form a light emitting diode device.

Referring to FIG. 3, the light emitting diode elements are formed to have the slanted side surfaces 28a, 28b, and the transparent electrode 29, the insulation layer 31 and the interconnection lines 37 (see FIG. 1) are formed. Then, laser beams are radiated along a scribing line, followed by breaking the substrate 21, such that light emitting diodes are divided into individual chips. The scribing line is formed along an area between the slanted side surfaces 28b.

As a result, the light emitting diode shown in FIGS. 1 and 2 is completed, and includes the light emitting diode elements each having the slanted side surfaces 28a, 28b. Particularly, the side surfaces of the light emitting diode elements disposed adjacent the edge of the light emitting diode device are constituted by the slanted side surfaces 28b.

In the related art, disconnection of the interconnection lines 37 is prevented by forming the side surfaces of the light emitting diode elements to be slanted. However, when the side surfaces of the light emitting diode elements are slanted, light emitting areas of the light emitting diode elements, that is, the areas of the active layers 25 are decreased. A gentler slope of the slanted side surfaces 28a, 28b causes further reduction in light emitting area. Reduction in light emitting area of the light emitting diode elements results in deterioration in light output and increase in forward voltage Vf.

Exemplary embodiments of the disclosed technology in this document provide a light emitting diode device including a plurality of light emitting diode elements and capable of increasing light emitting areas of the light emitting diode elements without disconnection of interconnection lines.

Exemplary embodiments of the disclosed technology also provide a light emitting diode device including a plurality of light emitting diode elements and capable of reducing forward voltage of the light emitting diode elements while enhancing light output.

In one implementation, a light emitting diode device can be constructed to include a plurality of light emitting diode elements disposed on a substrate. In addition, at least one of the light emitting diode elements includes a side surface slanted at an angle of less than 90° relative to the substrate and a side surface perpendicular to the substrate. With this structure, the light emitting diode provides increased light emitting areas to the light emitting diode element, thereby decreasing forward voltage of the light emitting diode elements while enhancing light output.

In another implementation, a light emitting diode device may include: a substrate; a plurality of light emitting diode elements disposed on the substrate; and interconnection lines connecting the light emitting diode elements. In addition, the plurality of light emitting diode elements include outer light emitting diode elements aligned along an edge of the substrate, and each of the outer light emitting diode elements includes an inner face directed towards an adjacent light emitting diode element and an outer face disposed adjacent the edge of the substrate and directed towards an outside of the substrate. Further, the inner face of at least one of the outer light emitting diode elements may include a more gently slanted side surface than the outer face thereof.

Each of the interconnection lines may connect adjacent light emitting diode elements to each other through the more gently slanted side surface than the outer face.

In addition, the outer face of at least one of the outer light emitting diode elements may include a side surface substantially perpendicular to the substrate. Further, each of the outer faces of the outer light emitting diode elements may include a side surface perpendicular to the substrate. Furthermore, the perpendicular side surfaces may be flush with a side surface of the substrate.

Each of the outer faces may be composed of a single plane, but is not limited thereto. Alternatively, each of the outer faces may include a stepped portion.

In addition, each of the light emitting diode elements may include a first conductivity type semiconductor layer, an active layer, and a second conductivity type semiconductor layer. Here, the stepped portion may be formed on the first conductivity type semiconductor layer. Further, side surfaces of the active layer and the second conductivity type semiconductor layer may be covered with an insulation layer.

Embodiments as disclosed in this document provide a method of fabricating a light emitting diode device including a plurality of light emitting diode elements, which includes: growing a semiconductor stack including a first conductivity type semiconductor layer, an active layer and a second conductivity type semiconductor layer on a substrate; patterning the semiconductor stack to form an isolation trench in a unit light emitting diode chip area; and dividing the semiconductor stack and the substrate using a laser. Here, the plurality of light emitting diode elements include outer light emitting diode elements aligned along an edge of the substrate, and each of the outer light emitting diode elements includes an inner face formed by the isolation trench and an outer face formed by dividing the semiconductor stack using the laser, in which the inner face includes a more gently slanted side surface than the outer face.

During formation of the isolation trench, the inner face is formed to have a gentle slope and the outer face is formed by a laser beam, thereby increasing light emitting areas of the light emitting diode elements.

In some implementations, the method may further include etching the second conductivity type semiconductor layer and the active layer to expose the first conductivity type semiconductor layer before or after forming the isolation trench.

In some implementations, the method may further include forming interconnection lines, which connect adjacent first and second conductivity type semiconductor layers to each other across the isolation trench. With this structure, a relatively gently slanted inner face is provided to the interconnection lines, thereby preventing disconnection of the interconnection lines.

The first conductivity type semiconductor layer may be exposed in a contact area for forming an ohmic contact. In addition, the first conductivity type semiconductor layer may also be exposed in a scribing line area.

In some implementations, the method may further include forming an insulation layer covering the isolation trench and the scribing line area. The insulation layer exposes the contact area.

It is to be understood that both the foregoing general description and the following detailed description are exemplary and explanatory.

The disclosed technology can be implemented to achieve one or more advantages. For example, in a light emitting diode device including a plurality of light emitting diode elements, inner and outer faces of the light emitting diode elements arranged along an edge of a substrate are formed to have different slopes, thereby increasing light emitting areas of the light emitting diode elements while preventing disconnection of interconnection lines. As a result, the light emitting diode can decrease forward voltage of the light emitting diode elements while enhancing light output.

The technology disclosed in this patent document is described more fully hereinafter with reference to the accompanying drawings, in which exemplary embodiments are shown. The disclosed technology can be implemented in different forms and embodiments beyond the specific examples and embodiments in this document.

Further, it should be noted that the drawings are not to precise scale, and some of the dimensions, such as width, length, thickness, and the like, are exaggerated for clarity of description in the drawings. Like components are denoted by like reference numerals throughout the specification.

FIG. 4 is a schematic plan view of a light emitting diode device according to an exemplary embodiment of the disclosed technology, and FIG. 5 is a schematic cross-sectional view of the light emitting diode device taken along line B-B of FIG. 4.

Referring to FIG. 4 and FIG. 5, the light emitting diode device according to this embodiment includes a substrate 51, a plurality of light emitting diode elements (S1, S2, etc.), and interconnection lines 67. Further, the light emitting diode may include a first contact 63, a second contact 65, first and second electrode pads 69a, 69b, a transparent electrode 59, and an insulation layer 61. Here, each of the light emitting diode elements may include a first conductivity type semiconductor layer 53, an active layer 55, and a second conductivity type semiconductor layer 57.

The substrate 51 may be a sapphire ($Al_2O_3$) substrate, a silicon carbide (SiC) substrate, a gallium nitride (GaN) substrate, an indium gallium nitride (InGaN) substrate, an aluminum gallium nitride (AlGaN) substrate, an aluminum nitride (AlN) substrate, a gallium oxide ($Ga_2O_3$) substrate, or a silicon substrate, without being limited thereto. The substrate 51 may be an insulation substrate such as a sapphire substrate, or a conductivity type substrate which includes an insulation layer on an upper side thereof. Particularly, the substrate 51 is a patterned sapphire substrate.

The substrate 51 has a generally quadrangular shape and may have a rectangular shape, as shown in the drawings, without being limited thereto. The substrate 51 has an upper surface, a lower surface, and side surfaces connecting the upper and lower surfaces to each other. The upper surface of the substrate 51 is surrounded by an edge thereof.

The plurality of light emitting diode elements S1, S2, etc. are aligned on the upper surface of the substrate 51. As shown in FIG. 5, each of the light emitting diode elements is a semiconductor stack, which includes the first conductivity type semiconductor layer 53, the active layer 55 and the second conductivity type semiconductor layer 57.

The active layer 55 may have a single quantum well structure or a multi-quantum well structure, and the materials and composition of the active layer are determined depending upon desired wavelengths of light emitted from the light emitting diode elements. For example, the active layer 55 may be formed of an AlInGaN-based compound semiconductor, for example, InGaN. On the other hand, the first and second conductivity type semiconductor layers 53, 57 are formed of a material having a greater band gap than the active layer 55, and formed of an AlInGaN-based compound semiconductor, for example, GaN.

As shown, the second conductivity type semiconductor layer 57 is disposed on some regions of the first conductivity type semiconductor layer 53, and the active layer 55 is disposed between the first conductivity type semiconductor layer 53 and the second conductivity type semiconductor layer 57. A contact area 53a of the first conductivity type semiconductor layer 53 is exposed. The first conductivity type semiconductor layer 53 and the second conductivity type semiconductor layer 57 may be an n-type semiconductor layer and a p-type semiconductor layer, respectively, or vice versa.

As shown in FIG. 4, the light emitting diode elements include outer light emitting diode elements aligned along the edge of the substrate 51. Each of the outer light emitting diode elements includes an inner face 58a directed towards an adjacent light emitting diode element and an outer face 58b disposed adjacent the edge of the substrate 51 and directed towards an outside of the substrate 51. Although not shown in FIG. 4, the light emitting diode elements may include inner light emitting diode elements aligned on the substrate 51 and surrounded by the outer light emitting diode elements. The inner light emitting diode elements have side surfaces, which are constituted by the inner faces 58a directed towards adjacent light emitting diode elements, and do not have the outer face 58b.

As shown in FIG. 5, the inner face 58a includes a more gently slanted side surface than the outer face 58b. The inner face 58a is gently slanted to prevent disconnection of the interconnection lines 67. The outer face 58b may include a side surface substantially perpendicular to the upper surface of the substrate 51. In addition, the outer face 58b may be flush with the side surface of the substrate 51 and may be formed together with the side surface of the substrate 51 by the same process.

The transparent electrode 59 may be disposed on the second conductivity type semiconductor layer 57. The transparent electrode 59 may be formed of a transparent oxide, such as indium tin oxide (ITO), or a transparent metallic material, such as Ni/Au or the like.

The first contact 63 may be disposed on the contact area 53a of the first conductivity type semiconductor layer 53 and the second contact 65 may be disposed on the second conductivity type semiconductor layer 57. The second contact 65 may be electrically connected to the second conductivity type semiconductor layer 57 through the transparent electrode 59.

On the other hand, the first and second electrode pads 69a, 69b are disposed on the substrate 51. The first electrode pad 69a is electrically connected to the first conductivity type semiconductor layer 53 of one light emitting diode element, and the second electrode pad 69b is electrically connected to the second conductivity type semiconductor layer 57 of another light emitting diode element.

As shown in FIG. 4, each of the first and second electrode pads 69a, 69b may be disposed on the light emitting diode elements, but is not limited thereto. Alternatively, the first and second electrode pads 69a, 69b may be separated from the light emitting diode elements. For example, the first and second electrode pads 69a, 69b may be formed on the substrate 51, on the first conductivity type semiconductor layer 53, on the second conductivity type semiconductor layer 57, or on the transparent electrode 59, while being separated from the light emitting diode elements.

The first and second electrode pads 69a, 69b receive power from an external power source and may be bonded to, for example, bonding wires. The light emitting diode is operated by power applied to the first and second electrode pads 69a, 69b.

The interconnection lines 67 electrically connect adjacent light emitting diode elements to each other. The interconnection lines 67 may connect adjacent light emitting diode elements to each other in series. Specifically, the interconnection lines 67 connect the first contact 63 of one light emitting diode element to the second contact 65 of another light emitting diode element adjacent thereto. The interconnection lines 67 pass through the inner faces 58a of the light emitting diode elements. Particularly, the interconnection lines 67 pass through relatively gently slanted side surfaces, whereby disconnection of the interconnection lines can be prevented. The interconnection lines 67 may be formed of the same material as that of the first and second contacts 63, 65 by the same process.

On the other hand, the insulation layer 61 is disposed between the interconnection lines 67 and the light emitting diode elements, and prevents short circuit between the second conductivity type semiconductor layer 57 and the first conductivity type semiconductor layer 53 in one light emitting diode element by the interconnection lines 67. Further, the insulation layer 61 may cover the inner faces 58a of the light emitting diode elements to protect the light emitting diode elements.

In this embodiment, all of the inner faces 58a are illustrated as the relatively gently slanted side surfaces. In alternative embodiments, some inner faces passing through the interconnection lines 67 are gently slanted, and the other inner faces may be steeply slanted side surfaces like the outer faces 58b.

According to this embodiment, the side surface of the light emitting diode element on which the interconnection lines 67 are formed, that is, the inner face 58a of the light emitting diode element, has a relatively gentle slope, and the outer face 58b thereof has a relatively steep slope. Accordingly, in this embodiment, the outer face 58b of the light emitting diode element may be disposed farther outside than the outer face 28b of the typical light emitting diode element, as shown in FIG. 5, thereby increasing a light emitting area of the light emitting diode element.

FIG. 6 is a schematic sectional view illustrating a method of fabricating a light emitting diode according to an exemplary embodiment of the disclosed technology.

Referring to FIG. 6, a semiconductor stack, which includes a first conductivity type semiconductor layer 53, an active layer 55 and a second conductivity type semiconductor layer 57, is grown on a substrate 51. These semiconductor layers may be grown by various methods, such as metal organic chemical vapor deposition (MOCVD), molecular beam epitaxy (MBE), hydride vapor phase epitaxy (HVPE), and the like.

Then, the semiconductor stack is subjected to patterning to form an isolation trench in a unit light emitting diode chip area. The isolation trench corresponds to a groove which divides the light emitting diode elements from one another in FIGS. 4 and 5.

Conventionally, the isolation trench is formed to divide not only individual light emitting diode elements in the unit light emitting diode chip area, but also the light emitting diode elements of adjacent light emitting diode chip areas. However, in this embodiment, the isolation trench is formed to divide the light emitting diode elements in the unit light emitting diode chip area from each other without dividing the light emitting diode elements of adjacent chip areas.

Before or after dividing the semiconductor stack, etching, that is, mesa etching, is performed to partially expose the first conductivity type semiconductor layer 53. The first conductivity type semiconductor layer 53 of the contact area 53a is exposed by mesa etching.

On the other hand, a transparent electrode 59 is formed on each of the light emitting diode elements. The transparent electrode 59 may be formed before or after formation of the isolation trench.

Further, a first contact 63 and a second contact 65 are formed on each of the light emitting diode elements, and interconnection lines 67 may connect the first contact 63 of one light emitting diode element to the second contact 65 of another light emitting diode element adjacent thereto. The interconnection lines 67 are formed to pass through the isolation trench. Further, the interconnection lines 67 may be formed such that the first and second electrode pads 39a, 39b are electrically connected to the first and second conductivity type semiconductor layers 53, 57, respectively. The first contact 63, second contact 65, interconnection lines 67, first electrode pad 39a and second electrode pad 39b may be formed by the same process using photolithography and etching, or using a lift-off process.

Before formation of the interconnection lines 67, an insulation layer 61 may be formed to isolate the interconnection lines 67 from the light emitting diode elements. The insulation layer 61 may be formed of, for example, $SiO_2$, without being limited thereto.

Then, the semiconductor stack and the substrate are divided by a laser beam. The laser beam is radiated along a scribing line. Scribing may be performed using a laser, and then, the substrate may be divided into individual light emitting diode chips by breaking.

Through division of the substrate using the laser, the substrate and light emitting diode elements between adjacent light emitting diode chip areas are divided. Thus, the outer light emitting diode elements are aligned along an edge of the substrate formed through division of the substrate, and the outer faces 58b of the outer light emitting diode elements are formed.

The inner faces 58a formed by the isolation trench include more gently slanted side surfaces than the outer faces 58b formed by dividing the semiconductor stack using the laser. Accordingly, it is possible to prevent disconnection of the interconnection lines 67 passing through the isolation trench.

On the other hand, the outer faces 58b are formed through division of the substrate using the laser instead of using the isolation trench, whereby the light emitting diode elements have increased light emitting areas.

FIG. 7 is a schematic plan view of a light emitting diode device according to an exemplary embodiment of the present invention and FIG. 8 is a schematic cross-sectional view of the light emitting diode taken along line B-B of FIG. 7.

Referring to FIG. 7 and FIG. 8, the light emitting diode device according to this embodiment is generally similar to the light emitting diode described with reference to FIGS. 4 and 5 except that outer light emitting diode elements have stepped portions on outer faces thereof.

Specifically, each of the outer light emitting diode elements includes not only a contact area 53a, but also a first conductivity type semiconductor layer area 53b exposed along an edge of a substrate 51. As a result, the outer light emitting diode elements have the stepped portion formed on the outer face 58b thereof. Each of the stepped portions is formed on the first conductivity type semiconductor layer 53 and side surfaces of the active layer 55 and the second conductivity type semiconductor layer 57 are disposed on an inner area of the substrate 51.

On the other hand, as described with reference to FIGS. 4 and 5, an insulation layer 61 isolates the interconnection lines 67 from the light emitting diode elements. The insulation layer 61 covers the exposed area 53b of the first conductivity semiconductor layer, and may cover side surfaces of an active layer 55 and a second conductivity type semiconductor layer 57.

According to this embodiment, the insulation layer 61 may cover the sides surfaces of the active layer 55 and the second conductivity type semiconductor layer 57 to prevent the active layer 55 from being exposed outside, whereby the light emitting diode elements can be protected from moisture or the like, thereby improving reliability of the light emitting diode.

FIG. 9 is a schematic sectional view illustrating a method of fabricating a light emitting diode device according to an exemplary embodiment of the disclosed technology.

Referring to FIG. 9, the method according to this embodiment is generally similar to the method described with reference to FIG. 6 except that a first conductivity semiconductor layer area 53b is exposed along a scribing line before radiation of laser beams. The first conductivity semiconductor layer area 53b may be subjected to mesa etching to expose a contact area 53a.

In this embodiment, an insulation layer 61 may be formed to cover the exposed area 53b of the first conductivity semiconductor layer while covering side surfaces of an active layer 55 and a second conductivity type semiconductor layer 57.

According to this embodiment, as the first conductivity semiconductor layer area 53b is exposed along the scribing line by mesa etching, the insulation layer 61 may cover the side surfaces of the active layer 55 and the second conductivity type semiconductor layer 57.

Although some embodiments have been described above, the disclosed technology can be implemented in other embodiments beyond these embodiments and features, and various modifications, changes, and alterations can be made.

The invention claimed is:

1. A light emitting diode device comprising:
   a substrate;
   a plurality of light emitting diode elements disposed on the substrate and including outer light emitting diode elements that include a first light emitting diode element and a second light emitting diode and are aligned along an edge of the substrate; and
   interconnection lines formed on the substrate to connect the light emitting diode elements in series with one another and including an interconnection line connecting the first light emitting diode element to the second light emitting diode element in series and disposed along the edge of the substrate,
   wherein each of the outer light emitting diode elements includes an inner face directed towards an adjacent light emitting diode element at a first angle with respect to a surface of the substrate and an outer face disposed adjacent the edge of the substrate and directed towards an outside of the substrate at a second angle with respect to the surface of the substrate, the first angle being less than the second angle,
   wherein at least one of the outer light emitting diode elements includes a first side surface disposed adjacent an edge of a side surface of the substrate and a second side surface disposed adjacent an edge of another side surface of the substrate.

2. The light emitting diode device of claim 1, wherein at least one of the outer light emitting diode elements is disposed on an edge portion of the substrate and the edge portion is adjacent to a corner where two side surfaces of the substrate meet each other.

3. The light emitting diode device of claim 1, wherein each of the interconnection lines connects adjacent light emitting diode elements to each other through the inner face.

4. The light emitting diode device of claim 1, wherein the outer face of at least one of the outer light emitting diode elements comprises a side surface perpendicular to the substrate.

5. The light emitting diode device of claim 1, wherein each of the outer faces of the outer light emitting diode elements comprises a side surface perpendicular to the substrate.

6. The light emitting diode device of claim 4, wherein the perpendicular side surfaces are flush with a side surface of the substrate.

7. The light emitting diode device of claim 1, wherein each of the outer light emitting diode elements includes a stepped portion.

8. The light emitting diode device of claim 7, wherein each of the light emitting diode elements comprises a first conductivity type semiconductor layer, an active layer and a second conductivity type semiconductor layer,
the stepped portion being formed on the first conductivity type semiconductor layer,
side surfaces of the active layer and the second conductivity type semiconductor layer being covered with an insulation layer.

9. A method of fabricating a light emitting diode device including a plurality of light emitting diode elements, comprising:
growing a semiconductor stack on a substrate, the semiconductor stack comprising a first conductivity type semiconductor layer, an active layer, and a second conductivity type semiconductor layer;
patterning the semiconductor stack to form an isolation trench in a unit light emitting diode chip area; and
dividing the semiconductor stack and the substrate using a laser,
wherein the plurality of light emitting diode elements comprise outer light emitting diode elements aligned along an edge of the substrate,
each of the outer light emitting diode elements comprises an inner face formed by the isolation trench to form a first angle with respect to a surface of the substrate and an outer face formed by dividing the semiconductor stack using the laser to form a second angle with respect to the surface of the substrate, the first angle being less than the second angle.

10. The method of claim 9, further comprising:
etching the second conductivity type semiconductor layer and the active layer to expose the first conductivity type semiconductor layer before or after forming the isolation trench.

11. The method of claim 10, further comprising:
forming interconnection lines connecting adjacent first and second conductivity type semiconductor layers to each other across the isolation trench.

12. The method of claim 11, wherein the first conductivity type semiconductor layer is exposed in a contact area for forming an ohmic contact and in a scribing line area.

13. The method of claim 12, further comprising:
forming an insulation layer covering the isolation trench and the scribing line area, the insulation layer exposing the contact area.

* * * * *